United States Patent
Maki

(10) Patent No.: US 10,804,681 B2
(45) Date of Patent: Oct. 13, 2020

(54) METHOD FOR MANUFACTURING A SPARK PLUG THAT MAKES WELDED PORTIONS UNIFORM

(71) Applicant: NGK SPARK PLUG CO., LTD., Nagoya-shi, Aichi (JP)

(72) Inventor: Shunsuke Maki, Nagoya (JP)

(73) Assignee: NGK SPARK PLUG CO., LTD., Nagoya-shi, Aichi (JP)

( * ) Notice: Subject to any disclaimer, the term of this patent is extended or adjusted under 35 U.S.C. 154(b) by 0 days.

(21) Appl. No.: 16/477,551

(22) PCT Filed: Sep. 26, 2017

(86) PCT No.: PCT/JP2017/034642
§ 371 (c)(1),
(2) Date: Jul. 12, 2019

(87) PCT Pub. No.: WO2018/131220
PCT Pub. Date: Jul. 19, 2018

(65) Prior Publication Data
US 2019/0363521 A1 Nov. 28, 2019

(30) Foreign Application Priority Data
Jan. 13, 2017 (JP) .................. 2017-003892

(51) Int. Cl.
*H01T 13/32* (2006.01)
*H01T 21/02* (2006.01)
(52) U.S. Cl.
CPC ............. *H01T 13/32* (2013.01); *H01T 21/02* (2013.01)

(58) Field of Classification Search
CPC .................................. H01T 13/16; H01T 13/34
See application file for complete search history.

(56) References Cited

U.S. PATENT DOCUMENTS

| | | | | |
|---|---|---|---|---|
| 2010/0275870 A1* | 11/2010 | Kameda | ................... | H01T 13/16 123/169 EL |
| 2014/0167595 A1* | 6/2014 | Kurono | ................... | H01T 13/34 313/143 |

FOREIGN PATENT DOCUMENTS

| | | |
|---|---|---|
| JP | S62-34682 A | 2/1987 |
| JP | 2008-103147 A | 5/2008 |
| JP | 2011-082084 A | 4/2011 |
| JP | 2014-144469 A | 8/2014 |

OTHER PUBLICATIONS

International Search Report from corresponding International Patent Application No. PCT/JP2017/034642, dated Oct. 31, 2017.

* cited by examiner

*Primary Examiner* — Tracie Y Green
(74) *Attorney, Agent, or Firm* — Kusner & Jaffe

(57) ABSTRACT

A method for manufacturing a spark plug so as to make welded portions uniform. A method, for manufacturing a spark plug having a ground electrode to which a tip is welded, includes: a preparation step of preparing the ground electrode in which a plating layer is formed so as to at least exclude a first portion to which the tip is to be welded; an application step of applying a laser beam or electron beam to the first portion of the ground electrode after the preparation step; and a joining step of joining the tip to the first portion of the ground electrode by resistance welding after the application step.

1 Claim, 5 Drawing Sheets

METHOD FOR MANUFACTURING A SPARK PLUG THAT MAKES WELDED PORTIONS UNIFORM

FIELD OF THE INVENTION

The present invention relates to a method for manufacturing a spark plug, and particularly to a method for manufacturing a spark plug in which a tip is joined to a ground electrode by resistance welding.

BACKGROUND OF THE INVENTION

A spark plug in which a tip containing a precious metal is joined to a ground electrode in order to enhance spark wear resistance, is known. Japanese Patent Application Laid-Open (kokai) No. 2011-82084 discloses a technique in which, after plating of a front end portion of a zinc-plated or nickel-plated ground electrode is removed, a tip is overlaid on the front end portion of the ground electrode, and the front end portion and the tip are joined to each other by resistance welding using Joule heat generated by contact resistance between the front end portion and the tip.

However, in the above-described conventional art, contact resistance between the tip and the front end portion varies for each workpiece due to variation of a surface state of the front end portion from which the plating has been removed, or an oxide film that covers the front end portion, and welded portions may be non-uniform among workpieces.

The present invention has been made in order to solve the aforementioned problem. An advantage of the present invention is a method for manufacturing a spark plug so as to make welded portions uniform.

SUMMARY OF THE INVENTION

In accordance with a first aspect of the present invention, there is provided a method for manufacturing a spark plug having a ground electrode to which a tip is welded, wherein the method includes: a preparation step of preparing the ground electrode in which a plating layer is formed so as to at least exclude a first portion to which the tip is to be welded; an application step of applying a laser beam or electron beam to the first portion of the ground electrode after the preparation step; and a joining step of joining the tip to the first portion of the ground electrode by resistance welding after the application step.

According to the method for manufacturing the spark plug as described above, the ground electrode having the plating layer formed thereon so as to at least exclude the first portion to which the tip is to be welded, is prepared in the preparation step. In the application step, a laser beam or electron beam is applied to the first portion of the ground electrode after the preparation step. Therefore, variation in surface state of the first portion for each workpiece can be reduced. Variation in contact resistance between the tip and the first portion of the ground electrode after the application step can be reduced, thereby obtaining an effect that welded portions at which the tips are joined by resistance welding can be made uniform among workpieces.

According to a second aspect of the present invention, there is provided a method for manufacturing the spark plug, the ground electrode prepared in the preparation step has the plating layer formed thereon so as to at least exclude a second portion disposed on the reverse side of the first portion. In the application step, a laser beam or electron beam is applied to the second portion of the ground electrode after the preparation step. Therefore, variation in the surface state of the second portion can be reduced. The tip is overlaid on the first portion of the ground electrode, the tip and the second portion of the ground electrode are disposed between electrodes, pressure is applied to the electrodes, and electric current is caused to pass therethrough, whereby the tip and the ground electrode are joined to each other. Variation in contact resistance between the second portion of the ground electrode and the electrode can be reduced. Therefore, an effect of enhancing uniformity of the welded portions can be obtained in addition to the effect of the first aspect of the present invention being obtained.

DETAILED DESCRIPTION OF THE INVENTION

Figure 1:
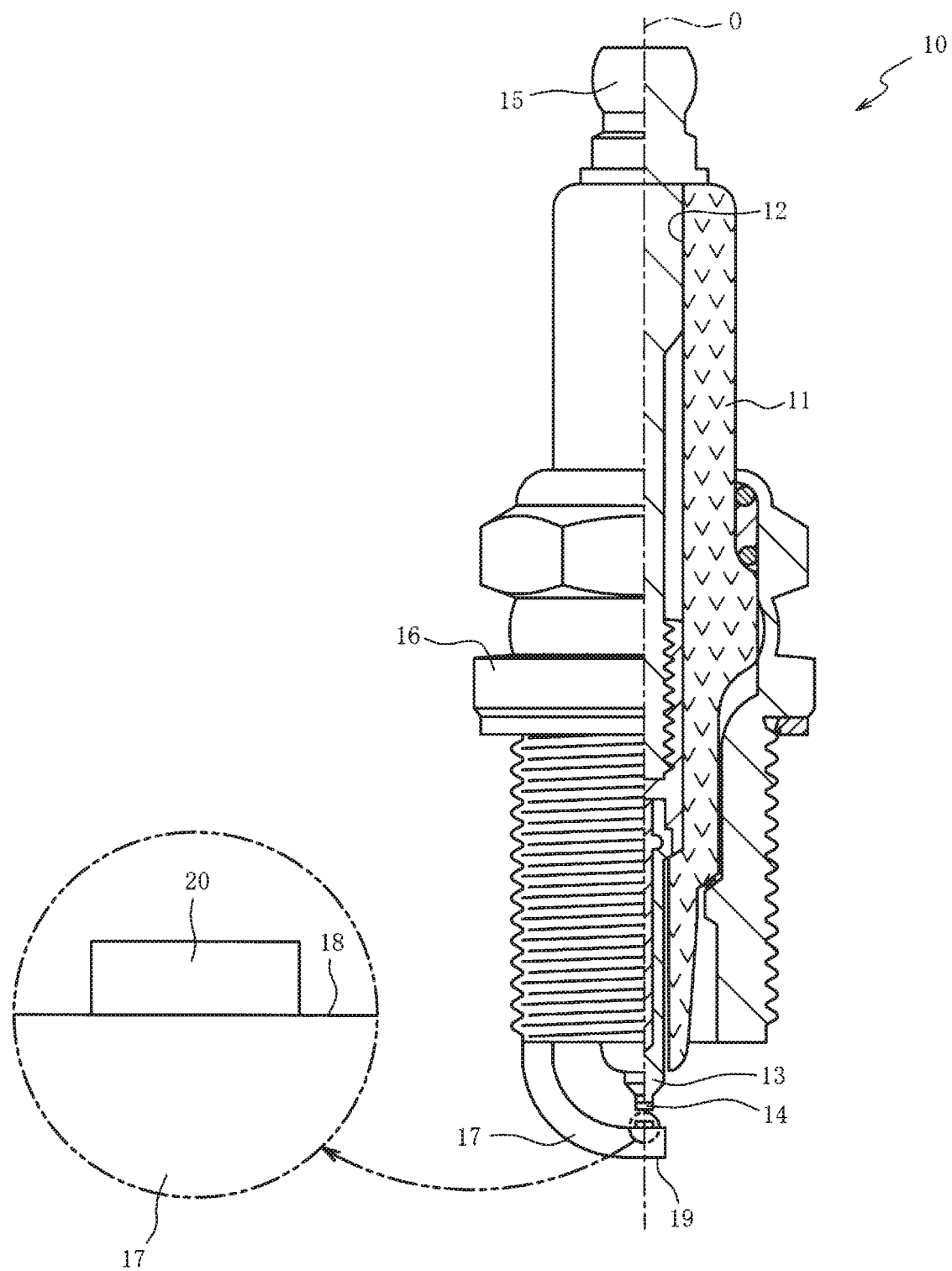
FIG. 1 is a cross-sectional view of one side of a spark plug.

A preferred embodiment of the present invention will be described below with reference to the accompanying drawings. FIG. 1 is a cross-sectional view of one side of a spark plug 10 according to one embodiment of the present invention. In FIG. 1, the lower side on the sheet of the drawing is referred to as the front side of the spark plug 10, and the upper side on the sheet of the drawing is referred to as the rear side of the spark plug 10. The spark plug 10 includes an insulator 11, a metal shell 16, and a ground electrode 17.

The insulator 11 is a cylindrical member formed from alumina or the like which has excellent mechanical properties and insulation properties at high temperatures, and the insulator 11 has an axial hole 12 formed so as to penetrate along an axial line O. A center electrode 13 is disposed on the front side of the axial hole 12.

The center electrode 13 is a rod-shaped member that extends along the axial line O, and a core material formed from copper or a core material that contains copper as a main component is covered with nickel or a nickel-based alloy. The center electrode 13 is held by the insulator 11, and the front end thereof is exposed from the axial hole 12. In the center electrode 13, a tip 14 that contains a precious metal is joined to the front end thereof.

A metal terminal 15 is a rod-shaped member to which a high-voltage cable (not shown) is to be connected, and is formed from a conductive metal material (for example, low-carbon steel or the like). The metal terminal 15 is fixed to the rear end of the insulator 11 in a state where the front side thereof is pressed into the axial hole 12. The metal shell 16 is crimped and fixed on the front side of the outer circumference of the insulator 11 so as to be spaced from the metal terminal 15 in the axial line O direction.

The metal shell 16 is an almost cylindrical member formed from a conductive metal material (for example, low-carbon steel or the like). The ground electrode 17 is joined to the front end of the metal shell 16. The ground electrode 17 is a rod-shaped member made of a metal (for example, nickel-based alloy), and includes a first portion 18 disposed on the front side of the ground electrode 17, and a second portion 19 disposed on the reverse side of the first portion 18. A tip 20 that contains a precious metal is joined to the first portion 18. In the present embodiment, the ground electrode 17 is formed such that the front side thereof is bent and the first portion 18 opposes the center electrode 13 (tip 14). The tip 20 joined to the first portion 18 and the center electrode 13 (tip 14) form a spark gap therebetween.

The spark plug 10 is manufactured by, for example, the following method. Firstly, the center electrode 13 having the tip 14 which is previously joined to the front end of the center electrode 13 is inserted into the axial hole 12 of the insulator 11, and is disposed so as to expose the front end of the center electrode 13 outward from the axial hole 12. The metal terminal 15 is inserted into the axial hole 12, and conductivity between the metal terminal 15 and the center electrode 13 is assured. Thereafter, the metal shell 16 to which the ground electrode 17 is previously joined is mounted to the outer circumference of the insulator 11. The tip 20 is joined to the first portion 18 of the ground electrode 17. Thereafter, the ground electrode 17 is bent such that the tip 20 opposes the center electrode 13 (the tip 14). Thus, the spark plug 10 is obtained.

Figure 2:
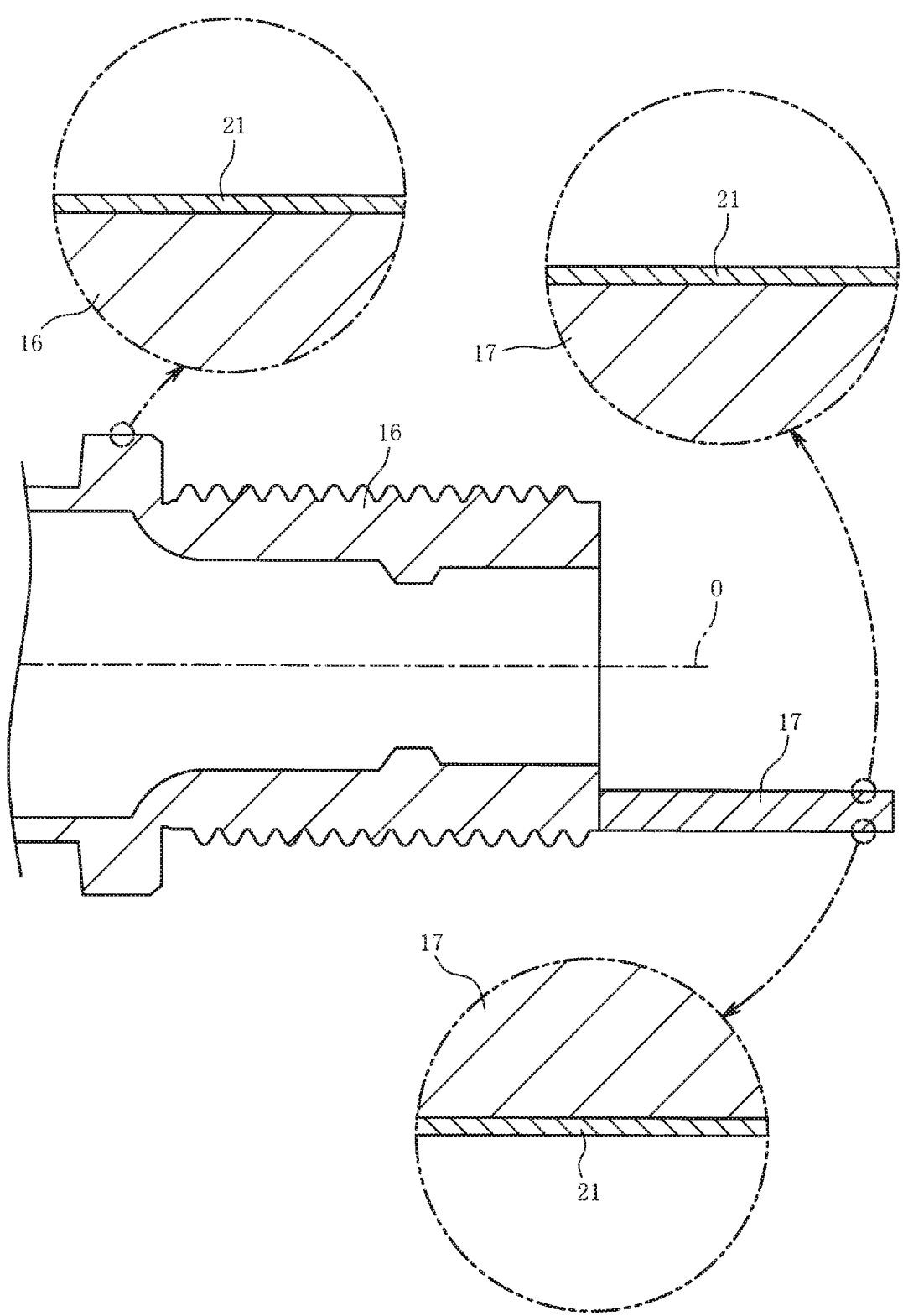
FIG. 2 is a cross-sectional view of a metal shell and a ground electrode.

A method for joining the tip 20 to the ground electrode 17 will be described with reference to FIG. 2 to FIG. 5. Firstly, the ground electrode 17 to which the tip 20 has not been joined will be described with reference to FIG. 2 to FIG. 4. FIG. 2 is a cross-sectional view including the axial line O of the metal shell 16 and the ground electrode 17. FIG. 2 illustrates a state where the metal shell 16 has not been mounted to the insulator 11 and a state where the ground electrode 17 has not been bent.

As shown in FIG. 2, each of the ground electrode 17 joined to the metal shell 16, and the metal shell 16 has a plating layer 21 formed on the surface thereof. The plating layer 21 is a surface treatment layer mainly for improving corrosion resistance of the metal shell 16, and mainly contains, for example, zinc, chromate-treated zinc, nickel, or the like. The metal shell 16 to which the ground electrode 17 is joined, is subjected to barrel plating to form the plating layer 21. As a result, the plating layer 21 is formed on not only the surface of the metal shell 16 but also the surface of the ground electrode 17. When the tip 20 is welded onto the plating layer 21 formed on the ground electrode 17, welding defects are likely to arise. Therefore, the plating layer 21 on at least the first portion 18 (see FIG. 1) at which the tip 20 is to be welded is removed.

Figure 3A:
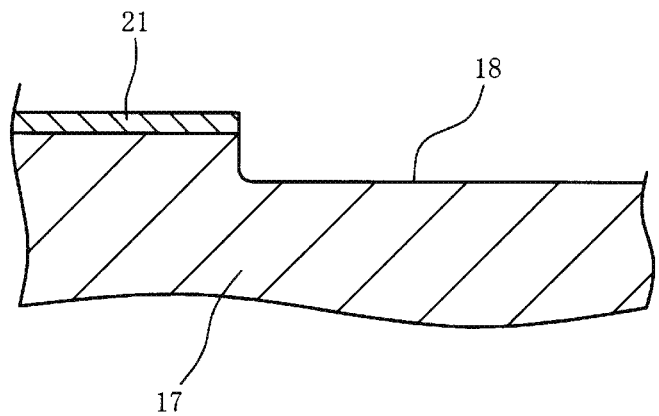
FIG. 3A is a cross-sectional view of the ground electrode from which a plating layer is removed.

FIG. 3A is a cross-sectional view of the ground electrode 17 from which the plating layer 21 has been removed. The plating layer 21 that covers the first portion 18 is partially removed by physical removal means such as ion etching or shot blasting, or chemical removal means such as immersion of the ground electrode 17 in peeling solution. In addition to the plating layer 21, a part of a base (surface) of the ground electrode 17 is also removed by the physical/chemical removal means.

In the present embodiment, by the front side of the ground electrode 17 covered with the plating layer 21 being immersed in peeling solution (not shown), the plating layer 21 that covers each of the first portion 18 and the second portion 19 (see FIG. 1) disposed on the reverse side of the first portion 18 is removed. Thus, the plating layer 21 of each of the first portion 18 and the second portion 19 can be efficiently removed, and the first portion 18 and the second portion 19 can be cleaned by etching effect using the peeling solution.

However, in the first portion 18 and the second portion 19 from which the plating layer 21 has been removed, a surface state varies for each workpiece. Furthermore, cleaning and drying after removal of the plating layer 21 causes oxidation of the surfaces of the first portion 18 and the second portion 19, and oxide films (not shown) are formed on the first portion 18 and the second portion 19. Variation of the surface states of the first portion 18 and the second portion 19 or the oxide films exert influence on the quality of resistance welding.

Figure 3B:
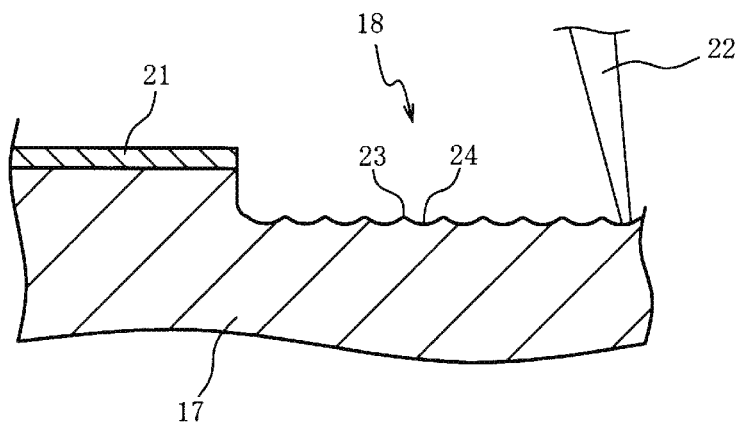
FIG. 3B is a cross-sectional view of the ground electrode to which a laser beam is applied.
Figure 4A:
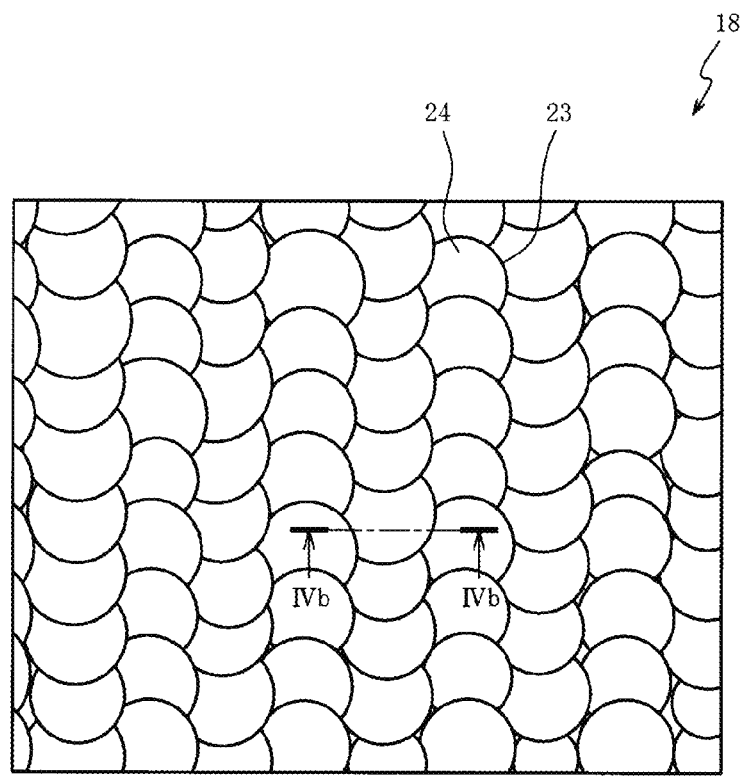
FIG. 4 is an enlarged view of the ground electrode to which a laser beam is applied.
FIG. 4B is a cross-sectional view of the ground electrode as taken along a line IVb-IVb in FIG. 4A.
Figure 4B:
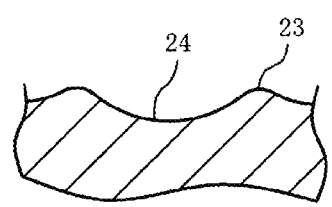

Therefore, in the present embodiment, a laser beam 22 is applied to the first portion 18 and the second portion 19 from which the plating layer 21 has been removed, in order to reduce variation of the surface states of the first portion 18 and the second portion 19. FIG. 3B is a cross-sectional view of the ground electrode 17 to which the laser beam 22 is applied. FIG. 4A is an enlarged view of the ground electrode 17 (first portion 18) to which the laser beam 22 is applied. FIG. 4B is a cross-sectional view of the ground electrode 17 as taken along a line IVb-IVb in FIG. 4A.

Each of the first portion 18 and the second portion 19 is a part, of the ground electrode 17, from which the plating layer 21 has been removed. Similarly to the first portion 18, the laser beam 22 is also applied to the second portion 19 from which the plating layer 21 has been removed, so that the second portion 19 is also in the same state as the first portion 18. Therefore, the first portion 18 is illustrated in FIG. 3B to FIG. 4B, and description of the second portion 19 is omitted.

As shown in FIG. 3B, the surface of the first portion 18 partially melts to form a liquid phase by the laser beam 22 being applied to the first portion 18. The liquid phase flows due to the effect of surface tension, and is thereafter solidified to form recesses 24 which are recessed relative to edge portions 23. The recesses 24 are formed in the first portion 18, and, thus, the surface state of the first portion 18 can be controlled. Therefore, variation in surface state of the first portion 18 among workpieces can be reduced.

When the laser beam 22 is used, the surface roughness of the first portion 18 can be controlled in a reproducible manner by controlling energy applied into the first portion 18, as compared to mechanical polishing or grinding using a polishing material such as a grindstone or a brush. A processing time can be shortened as compared to mechanical polishing or grinding, chemical polishing, and the like, and post-treatment such as washing and drying need not be performed. In the case of mechanical polishing using a polishing material such as a grindstone or a brush, the polishing material is worn, and a polishing material managing step is necessary. However, when the laser beam 22 is used, the management of the polishing material is unnecessary. Moreover, in addition to treatment being able to be performed in air, application of the laser beam 22 melts or sublimates an oxide film (not shown) that covers the surface of the first portion 18, whereby the first portion 18 can be cleaned.

As shown in FIG. 4A and FIG. 4B, in the present embodiment, the laser beam 22 (see FIG. 3B) is applied as pulse oscillation laser to the first portion 18. The first portion 18 is scanned along a continuous curve by the laser beam 22. One edge portion 23 and one recess 24 are formed at a duration time and intensity of one pulse of the laser. A plurality of the edge portions 23 and the recesses 24 are made continuous to form a plurality of recesses and projections in the first portion 18.

A melting depth can be reduced by pulse oscillation laser as compared to continuous wave laser. Therefore, the sizes of the recesses and projections can be easily controlled, and reproducibility and stability can be improved as compared to continuous wave laser. The size of one recess 24 is set so as to be smaller than an area of the tip 20 joined to the first portion 18. In the present embodiment, the size of one recess 24 is set to be 20 µm to 40 µm, and a difference between the maximum depth of the recess 24 and the maximum height of the edge portion 23 is set to be 1 µm to 10 µm and preferably 3 µm to 7 µm. Thus, a contact surface with the tip 20 is assured in resistance welding.

Figure 5:
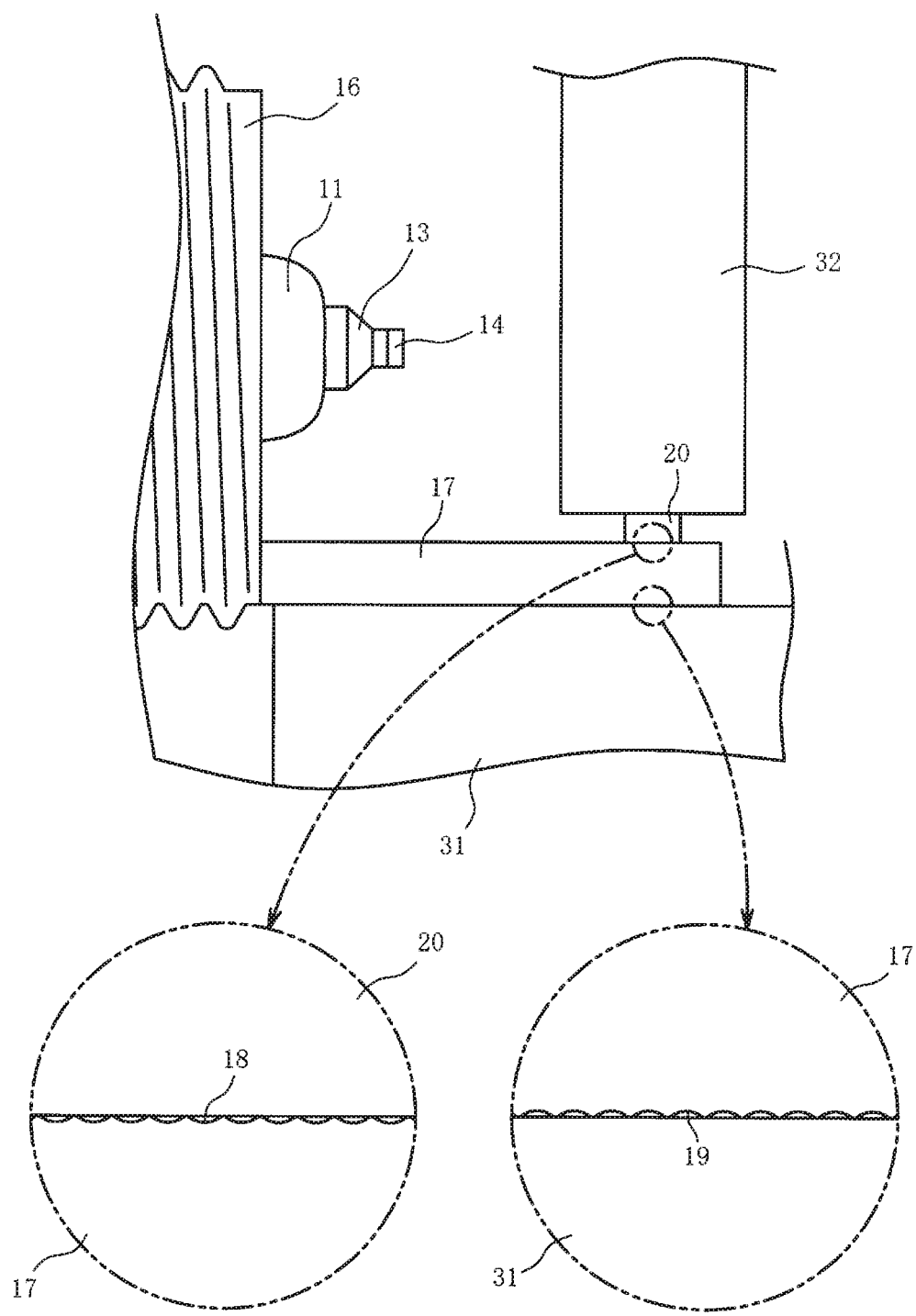
FIG. 5 is a side view of a tip and the ground electrode disposed between electrodes.

Next, resistance welding between the ground electrode 17 and the tip 20 will be described with reference to FIG. 5. FIG. 5 is a side view of the tip 20 and the ground electrode 17 disposed between electrodes (first electrode 31 and second electrode 32).

As shown in FIG. 5, the ground electrode 17 is previously joined to the metal shell 16 mounted to the outer circumference of the insulator 11. The tip 20 is overlaid on the first portion 18 of the ground electrode 17, and the second portion 19 of the ground electrode 17 and the tip 20 are disposed between the first electrode 31 and the second electrode 32. When pressure is applied to the first electrode 31 and the second electrode 32, and electric current is caused to pass through the first electrode 31 and the second electrode 32, Joule heat is generated due to contact resistance between the tip 20 and the first portion 18, and the tip 20 and the first portion 18 are melted and joined to each other.

The first portion 18 to which the laser beam 22 (see FIG. 3B) has been applied inhibits the surface state from varying for each workpiece. The oxide films (not shown) on the surfaces of the first portions 18 that have been melted and solidified can be formed in the same state among the workpieces. Therefore, contact resistance between the tip 20 and the first portion 18 can be stabilized. Accordingly, welded portions at each of which the tip 20 and the first portion 18 are melted and joined to each other can be made uniform.

Furthermore, the first portion 18 to which the laser beam 22 (see FIG. 3B) has been applied has a plurality of recesses and projections formed by the edge portions 23 and the recesses 24. The size of one recess 24 is smaller than the area of the tip 20. Thus, when the tip 20 is overlaid on the first portion 18, a plurality of the edge portions 23 contact with the tip 20. When pressure is applied, to the plurality of the edge portions 23 that contact with the tip 20, through the first electrode 31 and the second electrode 32, the edge portions 23 are elastically deformed or plastically deformed to obtain a predetermined contact surface. When, in this state, electric current passes through the first electrode 31 and the second electrode 32, the electric current flows so as to concentrate on the contact surface. The contact surface has a resistance higher than the other portions, and is thus heated and softened, and deformed to generate a new contact surface. Electric current easily flows through the new contact surface, thereby heating the new contact surface. The contact surface is thus widened while being heated to form a welded portion. Therefore, an effective cross-sectional area for welding can be stably assured, and the tip 20 can be joined to the first portion 18 in a reproducible manner.

The laser beam 22 (see FIG. 3B) is also applied to the second portion 19 of the ground electrode 17. Therefore, variation in the surface state of the second portion 19 can be also reduced. As a result, variation in contact resistance between the second portion 19 and the first electrode 31 can be reduced, whereby uniformity of welded portions at each of which the tip 20 is joined to the first portion 18 can be enhanced.

As described above, although the present invention has been described based on the embodiments, the present invention is not limited to the above-described embodiments at all. It can be easily understood that various modifications can be devised without departing from the gist of the present invention.

In the above-described embodiment, the laser beam 22 is applied as pulse oscillation laser to the first portion 18 and the second portion 19 of the ground electrode 17. However, the present invention is not necessarily limited thereto. Needless to say, instead of pulse oscillation laser, for example, the laser beam 22 may be applied as continuous wave laser to the ground electrode 17 to inhibit variation in surface state of the ground electrode 17. Continuous wave laser can also melt the surface of the ground electrode 17, similarly to pulse oscillation laser.

In the above-described embodiment, the laser beam 22 is applied to the first portion 18 and the second portion 19 of the ground electrode 17. However, the present invention is not necessarily limited thereto. Needless to say, instead of the laser beam 22, an electron beam may be applied to the ground electrode 17. Thus, the ground electrode 17 can be hit by accelerated electrons (thermoelectrons) to melt the surface of the ground electrode 17, similarly to the laser beam 22.

In the above-described embodiment, before the metal shell 16 having the ground electrode 17 joined thereto is mounted to the insulator 11, a part of the plating layer 21 formed on the ground electrode 17 is removed. However, the present invention is not necessarily limited thereto. Needless to say, after the metal shell 16 having the ground electrode 17 joined thereto has been mounted to the insulator 11, a part of the plating layer 21 formed on the ground electrode 17 may be removed.

In the above-described embodiment, the front side of the ground electrode 17 is immersed in peeling solution (not shown), and the plating layer 21 that covers the ground electrode 17 is chemically removed. However, the present invention is not necessarily limited thereto. Needless to say, a part of the plating layer 21 that covers the ground electrode 17 may be removed by physical removal means such as ion etching or shot blasting.

Furthermore, needless to say, masking in which the front end portion of the ground electrode 17 is covered by a rubber tube or the like may be performed without removing a part of the plating layer 21 after the entirety of the ground electrode 17 is covered with the plating layer 21. In this case, the masking prevents the front end portion of the ground electrode 17 from contacting with plating solution, whereby the plating layer 21 is formed on the remaining part of the ground electrode 17 so as to at least exclude the first portion 18 and the second portion 19.

In the above-described embodiment, the metal shell 16 having the ground electrode 17 joined thereto is subjected to barrel plating, and the plating layer 21 is formed on each of the metal shell 16 and the ground electrode 17. However, the present invention is not necessarily limited thereto. Needless to say, the plating layer 21 may be formed, by barrel plating or the like, on the metal shell 16 to which the ground electrode 17 has not been joined, and, thereafter, the ground electrode 17 on which the plating layer 21 has not been formed may be joined to the metal shell 16. In this case, a process of removing the plating layer 21 formed on the ground electrode 17 can be omitted.

In the above-described embodiment, only the plating layer 21 that covers the front end portion (the first portion 18 and the second portion 19) of the ground electrode 17 is removed. However, the present invention is not necessarily limited thereto. Needless to say, the plating layer 21 on the surface which is coplanar with the first portion 18 may be removed over a wide range up to a portion near the metal shell 16. Particularly, the plating layer 21 of the ground electrode 17 is preferably removed beyond a portion at which the ground electrode 17 is bent toward the center electrode 13. When the ground electrode 17 is bent toward the center electrode 13 in a state where the plating layer 21 is formed on the ground electrode 17, a part of the plating layer 21 may be separated due to the bending. In this case, spark discharge may occur between the center electrode 13 and a portion at which the plating layer 21 is separated, and ignitability may be deteriorated. This can be inhibited by eliminating the plating layer 21 at a portion at which the ground electrode 17 is bent.

In the above-described embodiment, direct-type resistance welding is performed in which the tip 20 is overlaid on the first portion 18 of the ground electrode 17, the second portion 19 is brought into contact with the first electrode 31, the tip 20 is brought into contact with the second electrode 32, and electric current is caused to pass through the first electrode 31 and the second electrode 32. However, the present invention is not necessarily limited thereto.

For example, in a case where the plating layer 21 on the surface which is coplanar with the first portion 18 of the ground electrode 17 is removed over a wide range up to a portion near the metal shell 16, or in a case where the plating layer 21 is not formed on the ground electrode 17, the laser beam 22 or electron beam is applied to the ground electrode 17 (a portion on which the plating layer 21 is not formed) on the surface which is coplanar with the first portion 18. Then, indirect-type resistance welding may be performed in which the tip 20 is overlaid on the first portion 18 of the ground electrode 17, the tip 20 is brought into contact with the second electrode 32, the first electrode 31 is brought into contact with the ground electrode 17 (a portion to which the laser beam 22 or electron beam has been applied) on the surface which is coplanar with the first portion 18, and electric current is caused to pass through the first electrode 31 and the second electrode 32. In this case, the laser beam 22 or electron beam need not be applied to the second portion 19 disposed on the reverse side of the first portion 18 of the ground electrode 17. This is because the second portion 19 does not contact with the first electrode 31.

In the above-described embodiment, the ground electrode 17 joined to the metal shell 16 is bent. However, the present invention is not necessarily limited thereto. Needless to say, instead of using the ground electrode 17 having been bent, a linear ground electrode may be used. In this case, the front side of the metal shell 16 is extended in the axial line O direction, and the linear ground electrode is joined to the metal shell 16 such that the ground electrode opposes the center electrode 13.

In the above-described embodiment, the ground electrode 17 is disposed such that the tip 20 opposes the center electrode 13 in the axial line O direction. However, the present invention is not necessarily limited thereto. A positional relationship between the ground electrode 17 and the center electrode 13 can be set as appropriate. Another positional relationship between the ground electrode 17 and the center electrode 13 may be, for example, a positional relationship in which the ground electrode 17 is disposed such that the tip 20 opposes the side surface of the center electrode 13 (tip 14). In this case, the first portion 18 may be disposed at the end surface of the ground electrode 17, and the tip 20 may be joined to the first portion 18 having been thus disposed.

DESCRIPTION OF REFERENCE NUMERALS

10: spark plug
17: ground electrode
18: first portion
19: second portion
20: tip
21: plating layer
22: laser beam

The invention claimed is:

1. A method for manufacturing a spark plug having a ground electrode to which a tip is welded, the method comprising:
  a preparation step of preparing the ground electrode in which a plating layer is formed so as to at least exclude a first portion to which the tip is to be welded;
  an application step of applying a laser beam or electron beam to the first portion of the ground electrode after the preparation step; and
  a joining step of joining the tip to the first portion of the ground electrode by resistance welding after the application step, wherein
  the ground electrode prepared in the preparation step has the plating layer formed therein so as to at least exclude a second portion disposed on a reverse side of the first portion, and
  a laser beam or electron beam is applied, in the application step, to the second portion of the ground electrode after the preparation step.

* * * * *